United States Patent [19]

Parker

[11] Patent Number: 4,531,069
[45] Date of Patent: Jul. 23, 1985

[54] LOGARITHMIC AMPLIFIERS

[75] Inventor: John A. Parker, Lowton, England

[73] Assignee: United Kingdom Atomic Energy Authority, London, England

[21] Appl. No.: 667,387

[22] Filed: Nov. 2, 1984

Related U.S. Application Data

[63] Continuation of Ser. No. 355,209, Mar. 5, 1982, abandoned.

[30] Foreign Application Priority Data

Mar. 6, 1981 [GB] United Kingdom ............... 8107054

[51] Int. Cl.³ .............................................. G06G 7/24
[52] U.S. Cl. .................................... 307/492; 328/145
[58] Field of Search ................ 307/490, 492; 328/144, 328/145

[56] References Cited

U.S. PATENT DOCUMENTS

| | | | |
|---|---|---|---|
| 3,435,353 | 3/1969 | Sauber | 307/492 |
| 3,636,338 | 1/1972 | Abrett et al. | 328/145 |
| 3,736,515 | 5/1973 | Kadron et al. | 328/145 |
| 3,757,234 | 9/1973 | Ohlson | 328/145 |
| 4,122,529 | 10/1978 | Hoech | 307/492 |

Primary Examiner—Stanley D. Miller
Assistant Examiner—B. P. Davis
Attorney, Agent, or Firm—William R. Hinds

[57] ABSTRACT

A logarithmic amplifier with a large range of input signal magnitude at high frequency. The amplifier comprises a number of similar stages arranged in cascades. Each stage has a logarithmic converter and an input stage constructed to maintain a consistent phase of signal and to feed a different range of signal amplitude to the respective converters. The outputs are summed.

4 Claims, 2 Drawing Figures

LOGARITHMIC AMPLIFIERS

This application is a continuation, of application Ser. No. 355,209, filed Mar. 5, 1982 now abandoned.

This invention relates to logarithmic amplifiers.

A logarithmic amplifier is an amplifier which produces an output signal which is proportional to the logarithm of the input signal. For example, the output may typically be of the order of one decade whereas the input may be several decades. Logarithmic amplifiers tend to use the junction properties of the semi conductors.

A problem that occurs in attempting to provide a logarithmic amplifier which can operate with an input signal over four decades of magnitude is that components in the amplifier may not be able to respond sufficiently quickly to high frequency signals of low magnitude, that is high frequency signals towards the smaller end of the range of magnitude of incoming signals. This problem is particularly acute if it is decided to provide an amplifier which can operate over say four decades.

An object of the present invention is to tend to provide a logarithmic amplifier which has an accurate response over a large range of input signal magnitude at high frequency.

According to the present invention, a logarithmic amplifier comprises;
 a number of similar stages arranged in cascade, which stages each have an associated logarithmic converter and each have an accurate cut off point in their amplification operation, an input arrangement for each of the stages, respectively, the input arrangements being constructed so as to maintain a consistent phase of signal to each of the stages and so as to feed a different range of incoming signal magnitudes to each stage, and
 a unit for combining the outputs of all the amplifier components, whereby a composite logarithmic output signal can be provided.

Preferably, the logarithmic converters each comprise a diode arrangement. The input arrangements may select the operational range of the amplifier components by means of attenuators. The outputs of all the amplifier components may be combined in a summing amplifier.

An embodiment of the present invention will now be described, by way of example only, with reference to the accompanying drawings in which.

Figure 1:
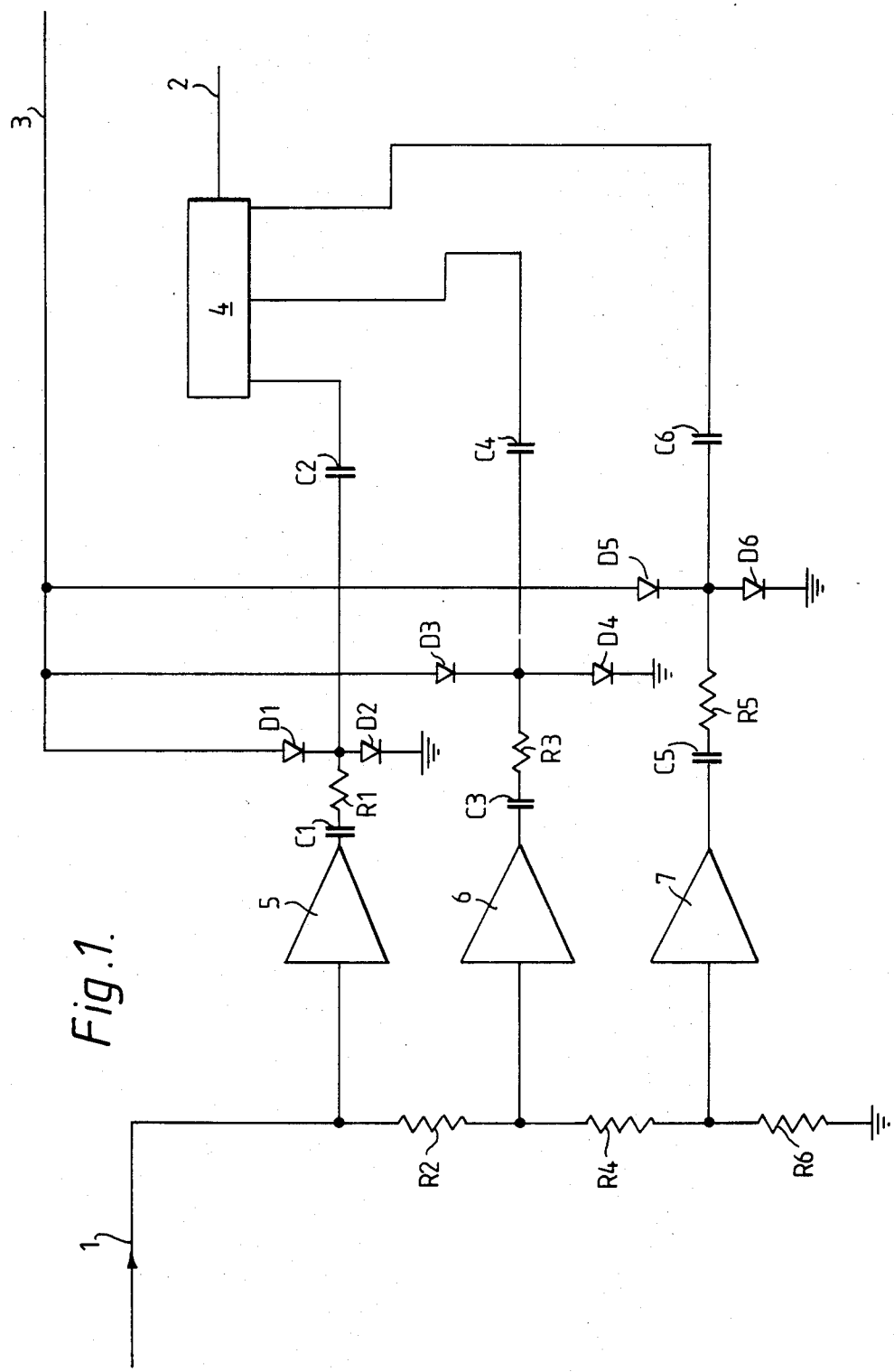
FIG. 1 is a schematic diagram of a logarithmic amplifier.

Reference is directed firstly to FIG. 1, in which an input signal line is generally indicated by 1 and an output signal line by 2. A driver voltage line is generally indicated by 3. The input signal 1 is fed via an amplifier 5 to a logarithmic converter component comprising diodes D1, D2, capacitor C1, resistor R1 and capacitor C2. After passing through capacitor C2, the signal is fed to a summing amplifier 4. The input signal 1 is also tapped for feeding to an amplifier 6 at a logarithmic converter component, similar to that described above, and comprising capacitor C3, resistor R3, diode D3, diode D4 and capacitor C4. The signal from this arrangement is also fed to the summing amplifier 4. The input signal 1 is further tapped for feeding to an amplifier 7 and a third logarithmic converter component comprising capacitor C5, resistor R5, diode D5, diode D6 and capacitor C6. The output from this third logarithmic converter is also fed to summing amplifier 4. The summing amplifier 4 sums all of its input signals and feeds them out to line 2. The mechanism of tapping the input signal 1 to the logarithmic converter via the respective amplifiers is via an attenuator comprising resistors R2, R4 and R6. In other embodiments of the invention, there may be further logarithmic converter amplifiers disposed in the line between resistor R6 and earth.

The amplifiers 5, 6 and 7 clip symmetrically on overload so that the useable range of voltage of the logarithmic amplifier components is well defined. The overall logarithmic amplifier comprises several stages, each including a logarithmic amplifier component as explained above. The dynamic range of the logarithmic amplifier is therefore extended by using several stages in parallel, ie cascading the stages, each stage covering a different range of signal amplitudes. The outputs of all of the stages are summed so as to give a logarithmic output signal. It is necessary, for the purposes of using a summing amplifier and obtaining an accurate output, that the outputs of all the stages be exactly in phase. This is achieved by the use of identical stages with attenuators (comprising the resistors R2, R4 and R6) to select the required input range. In FIG. 1, three stages are shown. If voltage amplifiers 5, 6 and 7 are changed to amplifiers with a current output, then resistors R1, R3 and R5 may be omitted. It is to be understood, that the attenuator network does not produce any phase shift.

In operation of the logarithmic amplifier described above in connection with FIG. 1, for a relatively small signal, the first stage of the logarithmic amplifier, comprising the amplifier 5 and a subsequent logarithmic converter component, produce a sinusoidal output which provides the major component of the output 2. The components of signal magnitude of the output signal 2 which is derived from the signals fed in from the second and third stages of the amplifier is much smaller. For a larger input signal, where the clipping voltage of the amplifier 5 is exceeded, then the first stage provides a square wave output which is clipped to the clipping value of the amplifier 5. The second stage amplifier 6 and its associated logarithmic converter component then provide a greater signal to the summing amplifier 4 and therefore a relatively greater component in the output signal on line 2. The third stage continues to provide a relatively small component of the output signal on line 2. For a signal towards the upper end of the range which the logarithmic amplifier can handle, the component of the output signal on line 2 is clipped by the amplifier 5 and the component supplied by the second stage is clipped by the amplifier 6. For such high values of signal, a component of output signal is provided by the third stage of the amplifier, which is of similar magnitude to that provided by the first and second stages of the amplifier.

In the above described arrangement, each stage only handles a limited range of signal amplitudes, so that signal currents can be kept large enough to drive stray capacitors. Further, since the arrangement does not require the application of negative feedback to high gain amplifiers, it is stable at high frequencies. A dynamic range of 70 dB at 5 megahertz may be obtained from a two stage circuit to be described below with reference to FIG. 2.

Figure 2:
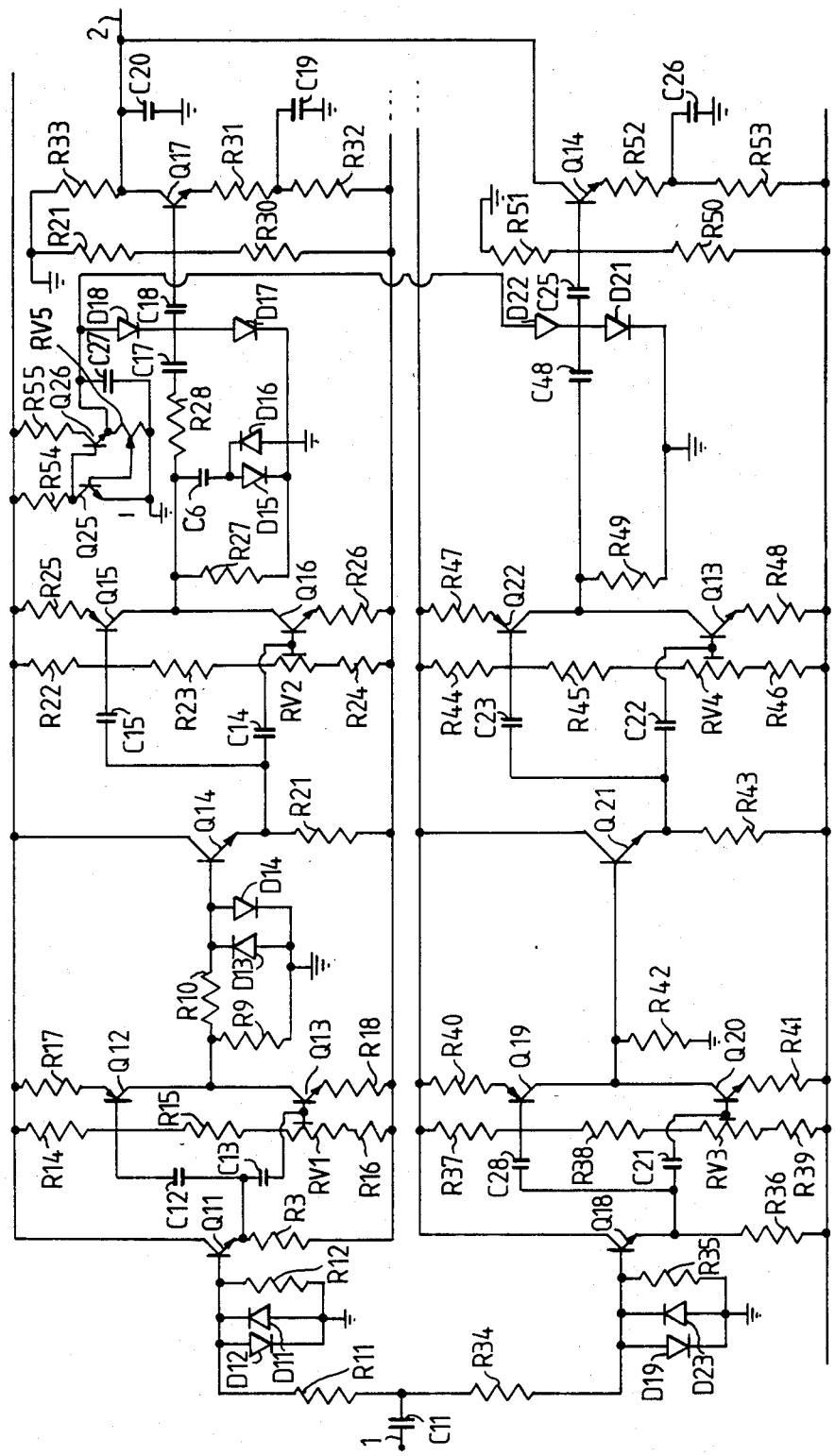
FIG. 2 is a detailed electrical circuit diagram.

Reference is now directed to FIG. 2, which shows a logarithmic amplifier in more detail, in FIG. 2 the logarithmic amplifier comprising two stages. The input signal is again indicated by 1 and the output signal by 2. In FIG. 2, one stage in the cascade of amplifiers is indicated in the upper part of the figure and the other stage in the lower part of the figure. It is to be understood that the upper stage is identical to the lower stage in terms of the numerical value of the components in these circuits, except for the attenuator biasing of the inputs as explained above.

The input signal is fed to the logarithmic amplifier via capacitor C11. The signal from C11 is fed to the first stage via a resistor R11. Clipping diodes D11 and D12 are provided for the purpose of clipping the voltage fed to the first stage and also for protecting the amplifier. The amplifier (corresponding for example to the amplifier 5 described above) comprises two common emitter amplifiers comprising transistors Q12 and Q13; and transistors Q15 and Q16 respectively. Q12 and Q15 are pnp transistors and Q13 and Q16 are npn transistors. The signal to the first common emitter amplifier is fed into the circuit by transistor Q11. The first of the common emitter amplifiers has associated therewith circuit components comprising resistors R14, R15, R17, R16 and R18 and capacitors C12 and C13. The second common emitter amplifier to which the signal is fed by transistor Q14 has associated therewith circuit components comprising resistors R22, R23, R25, R26, R24 and capacitors C14 and C15. R3 and R21 are emitter load resistors for transistors Q11 and Q14, respectively. A further voltage clipping for the input signal is provided by diodes D13 and D14 in association with resistors R9 and R10. The logarithmic converter component in this circuit is provided by the diodes D17 and D18. The diodes D17 and D18 pick up a driver voltage from the positive supply rail by virtue of a driver circuit comprising transistors Q25 and Q26 in association with resistors R54, R55 and RV5 and capacitor C27. The output current from amplifiers Q15 and Q16 is fed to diodes D17 and D18. The network R28, C6, D15 and D16 is provided to reduce overshoot when the amplifier is clipping. The output from the logarithmic converter component is fed to line 2 via an output stage comprising transistor Q17 in association with resistors R31, R32 and R33. The temperature coefficient of resistor R33 is selected to compensate for the temperature coefficient of the logarithmic converter.

The second stage of the logarithmic amplifier, comprising a circuitry to the lower half of FIG. 2, is substantially identical to that described above in connection with the upper half. The components of the upper half of the figure have corresponding components in the lower half of the figure although these are referenced differently to avoid confusion. The components are of the same value, except of course for the resistors R12 and R35, which are of different values for the purpose of providing attenuation as described above. However, for example R14 is the same as R37, R22 is the same as R44, Q14 is the same as Q21 and C12 is the same as C22. Therefore, the signal fed to the logarithmic converter component comprising diodes D18 and D17 is in phase with the signal which is fed to the logarithmic converter component comprising diodes D21 and D22. The component which is fed to the output line 2 from the first stage of the cascade will, in general, be much larger than that which is fed to the output line from the second stage of the cascade for low values of input signal. However, as the value of input signalling increases, then the contribution to the output signal from the lower half of FIG. 2, ie the second stage of the cascade, becomes relatively greater. This is because the output signal component from the first stage is clipped by the arrangement as described above.

From the above description, it can be seen that an improved logarithmic amplifier is provided.

I claim:

1. A logarithmic amplifier for receiving an AC input signal and providing an AC output signal, comprising: a number of similar stages arranged in cascade, which stages each include amplifier means and means forming an associated logarithmic converter and each have an accurate cut off point in their amplification operation, the output signal of each amplifier means passing to the associated logarithmic converter, each stage having an output signal, which output signals are in phase, an input arrangement for each of the stages, respectively, the input arrangements being constructed and arranged so as to maintain a consistent phase of signal to each of the stages and so as to feed a different range of incoming signal magnitude to each stage, and a unit for combining said output signals, whereby a composite AC output signal can be provided which is a function of the logarithm of the input signal.

2. A logarithmic amplifier as claimed in claim 1, in which the logarithmic converters each comprise a diode arrangement.

3. A logarithmic amplifier as claimed in claim 1, in which the input arrangements select the operational range of the amplifier components by means of attenuators.

4. A logarithmic amplifier as claimed in claim 1, in which the unit for combining the outputs of all the amplifier components comprises a summing amplifier.

* * * * *